United States Patent
Sutera et al.

(10) Patent No.: US 9,581,620 B2
(45) Date of Patent: Feb. 28, 2017

(54) INTEGRATED SEMICONDUCTOR DEVICE COMPRISING A HALL EFFECT CURRENT SENSOR

(71) Applicant: STMicroelectronics S.r.l., Agrate Brianza (IT)

(72) Inventors: Dario Sutera, Catania (IT); Davide Giuseppe Patti, Mascalucia (IT); Valeria Cinnera Martino, Valverde (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 113 days.

(21) Appl. No.: 14/615,196

(22) Filed: Feb. 5, 2015

(65) Prior Publication Data
US 2015/0219693 A1    Aug. 6, 2015

(30) Foreign Application Priority Data
Feb. 6, 2014    (IT) .............................. TO2014A0098

(51) Int. Cl.
| | |
|---|---|
| *G01R 15/20* | (2006.01) |
| *G01R 15/18* | (2006.01) |
| *G01R 19/00* | (2006.01) |
| *G01R 33/07* | (2006.01) |

(52) U.S. Cl.
CPC ............ *G01R 15/202* (2013.01); *G01R 15/18* (2013.01); *G01R 15/207* (2013.01); *G01R 19/0092* (2013.01); *G01R 33/07* (2013.01)

(58) Field of Classification Search
CPC combination set(s) only.
See application file for complete search history.

(56) References Cited

U.S. PATENT DOCUMENTS

| | | | |
|---|---|---|---|
| 3,800,193 A | 3/1974 | Ashar et al. | |
| 4,937,521 A * | 6/1990 | Yoshino | G01R 17/105 324/117 R |
| 4,972,140 A * | 11/1990 | Okazaki | G01R 15/202 324/117 H |
| 2007/0096717 A1 | 5/2007 | Ishihara | |
| 2008/0030190 A1* | 2/2008 | Ishihara | G01R 15/202 324/244 |
| 2010/0133632 A1* | 6/2010 | Schott | G01R 33/07 257/427 |
| 2013/0015839 A1 | 1/2013 | Franke | |

* cited by examiner

*Primary Examiner* — Clayton E Laballe
*Assistant Examiner* — Jas Sanghera
(74) *Attorney, Agent, or Firm* — Seed IP Law Group LLP

(57) ABSTRACT

The semiconductor integrated device has a conductive region, for example, an external contact pad, configured to be traversed by a current to be measured. A concentrator of magnetic material partially surrounds the conductive region and has an annular shape open at a point defining an air gap area where a sensitive region is arranged, which is electrically conductive and is typically of doped semiconductor material, such as polycrystalline silicon. The device is integrated in a chip formed by a substrate and by an insulating layer, the sensitive region and the concentrator being formed in the insulating layer.

23 Claims, 4 Drawing Sheets

INTEGRATED SEMICONDUCTOR DEVICE COMPRISING A HALL EFFECT CURRENT SENSOR

BACKGROUND

Technical Field

The present disclosure relates to an integrated semiconductor device comprising a Hall effect current sensor.

Description of the Related Art

As is known, it is frequently desired to accurately measure currents flowing in conductors, e.g., in conductive wires or structures provided in integrated electronic circuits both for detecting appropriate electrical quantities, correlated to the current flowing in the integrated electronic circuit, and for monitoring correct operation of the electronic circuit.

To this end, various solutions have been proposed.

In particular, the use of Hall sensors has already been proposed for measuring the current flowing in a wire, such as a coil, the sensor being able of generating a magnetic field correlated to the current in the wire.

These sensors exploit the well-known Hall effect, whereby, if current flows through a conductor immersed in a magnetic field, a transverse force is exerted on the charge carriers in motion in the conductor and this force tends to "push" the charge carriers onto one side of the conductor. This effect is particularly evident in a thin flat conductor. Accumulation of charges on the sides of the conductor causes a measurable voltage across the conductor and thus represents a measurement of the current flowing in the wire.

Known solutions involve, however, large dimensions and thus cannot be integrated. Furthermore, they do not enable measurement of currents flowing within an integrated circuit.

BRIEF SUMMARY

One embodiment of the present disclosure provides a current sensor using the Hall effect that overcomes the drawbacks of the prior art.

According to the present disclosure, an semiconductor integrated device and the corresponding manufacturing method are provided.

One embodiment of the present disclosure uses an integrated concentrator for concentrating the magnetic field generated by a current-conduction region, such as a wire, an electrical-connection line, a plug, or a contact pad in a point where a sensitive region is present and where the Hall effect takes place (defined hereinafter also as "Hall cell"). In one embodiment, an active area traversed by a current that is to be measured is surrounded by an open ferromagnetic ring, and a conductive plate forming the Hall cell is arranged at the gap. The measurement of the voltage across the plate thus provides an indication of the current o be measured.

BRIEF DESCRIPTION OF THE SEVERAL VIEWS OF THE DRAWINGS

For a better understanding of the present disclosure a preferred embodiment thereof is now described, purely by way of non-limiting example, with reference to the attached drawings, wherein.

DETAILED DESCRIPTION

Figure 1:
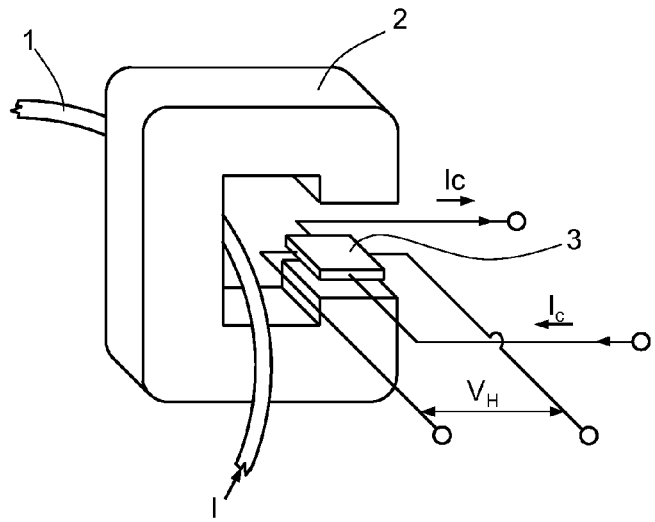
FIG. 1 shows a schematic diagram of a current sensor device according to one embodiment of the present disclosure.

FIG. 1 shows the schematic diagram of a sensor integrated in the present device. In detail, a primary current I or a current to be measured flows in a wire 1 extending through a C-shaped concentrator 2 of magnetic material.

A conductive plate 3 is arranged between the facing ends of the C shape. In this way, the concentrator 2 concentrates the magnetic field, generated by the primary current I in the wire 1, in the conductive plate 3. By connecting the plate 3 to be passed by a control current $I_c$, a voltage $V_H$ is generated by the Hall effect transversely with respect to the flow direction of the control current $I_c$.

Figure 2:
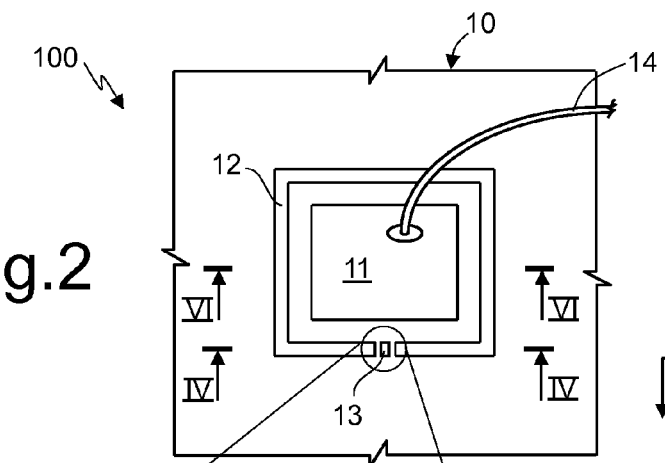
FIG. 2 is a top plan view of a current sensor device according to one embodiment of the present disclosure.

According to an integrated embodiment shown in FIG. 2, a device 100 is formed in a chip 10 of semiconductor material comprising an active area 11 (implementing the wire 1 of FIG. 1) and a concentrator 12 (corresponding to the concentrator 2 of FIG. 1), the concentrator being shaped as a ferromagnetic ring and surrounding at a distance the active area 11. The ferromagnetic ring forming the concentrator 12 is interrupted in one point, and a sensitive region 13 (implementing the plate 3 of FIG. 1), for example, of polycrystalline silicon, is arranged at the ring interruption.

The concentrator 12 is of ferromagnetic material such as Fe, Co, or Ni or some other high-permeability magnetic alloy.

The active area 11 is, for example, a contact pad and in this case is connected to a connection wire 14 and other contact structures in the chip 10 (as discussed hereinafter and shown in FIG. 6).

Figure 3:
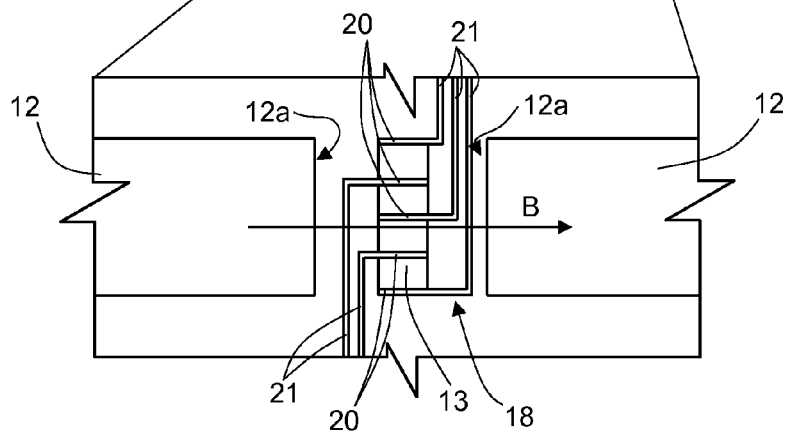
FIG. 3 shows an enlarged detail of FIG. 2.
Figure 4:
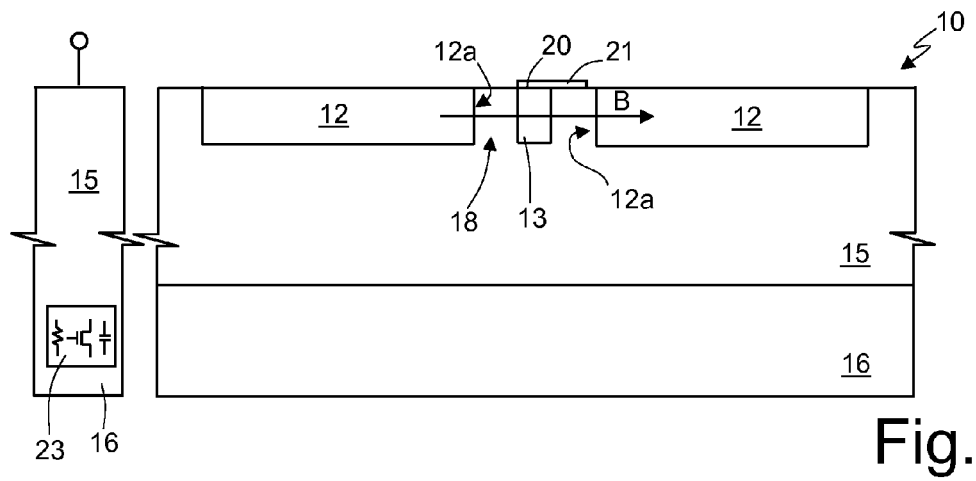
FIG. 4 is a cross section of the device, taken along the section line IV-IV of FIG. 2.
Figure 5:
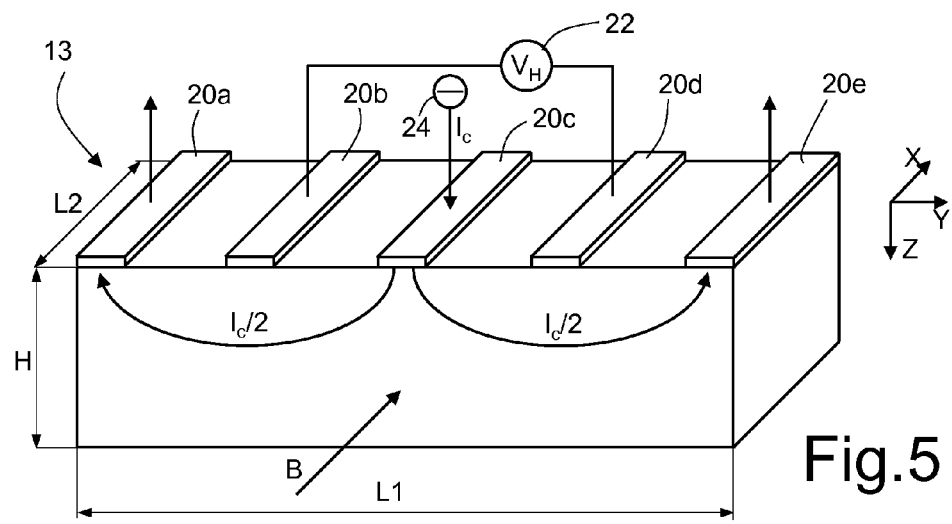
FIG. 5 is a perspective view of the structure of the Hall cell integrated in the device of FIG. 2.

FIGS. 3-5 show details of the embodiment of FIG. 2. Here, the sensitive region 13 is formed by a region of doped polysilicon within an insulating layer 15 extending over a semiconductor substrate 16, for example, of monocrystalline silicon.

In particular, the concentrator 12 has two ends 12a, mutually facing and delimited by surfaces that are transverse, in particular perpendicular, to the magnetic field B (FIGS. 3 and 4) and in turn delimit a gap 18 where the sensitive region 13 is positioned.

As may be seen in particular from FIG. 5, the sensitive region 13 here has a parallelepipedal shape, with the main side of the base parallel (in the top plan view of FIG. 3) to the ends 12a. The main side, having a length L1, in the reference system of FIGS. 2 and 5, is thus parallel to the axis Y and perpendicular to the magnetic field B. The sensitive region 13 further has a depth H (in the direction Z) slightly smaller than that of the concentrator 11 (FIG. 4). For instance, the sensitive region 13 may have a depth H of approximately 2 µm, a length L1 in the direction Y of approximately 5 µm, and width L2 in the direction X of approximately 0.8 µm.

Five contacts 20a, 20b, 20c, 20d and 20e of metal, such as copper or aluminum, are formed on the surface of the sensitive region 13 and extend parallel to each other and transverse to the sensitive region 13. In detail, the central contact 20c here forms an input contact of the control current $I_c$, and the two end contacts 20a and 20e form two output contacts. Obviously, the direction of the current may be opposite to that shown. The intermediate contacts 20b and 20d are connected to a voltmeter 22 represented only schematically, for example, integrated within the device 100, as shown schematically in FIG. 4 by circuitry 23. The circuitry 23 may also implement a current source, designated as a whole in FIG. 5 by 24 and generating the control current $I_c$. The contacts 20 are connected to conductive lines 21 (FIG. 3) of metal, such as copper or aluminum, which may be connected to the circuitry 23.

Figure 6:
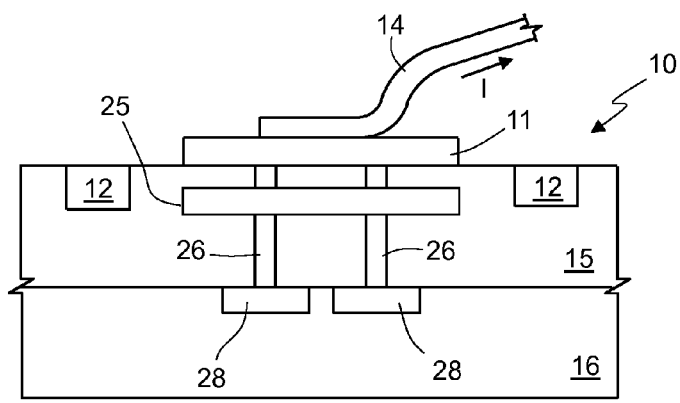
FIG. 6 is a cross-section of the present device, taken along the section line VI-VI of FIG. 2.

As shown in FIG. 6, the contact pad 11, of metal, overlies a metal region 25 in a metallization level, where electrical-connection lines (not shown) are formed between the components 23 of the device 100 integrated in the substrate 16 (FIG. 4). The contact pad 11 is connected to the metal region 25 and to operative regions 28 formed in the substrate 16 by plugs 26, in a per se known manner.

In the example shown, the concentrator 12 is formed on top of the level of the metal region 25 but underneath the contact pad 11; in the case of several metallization levels, the concentrator 12 may be formed on top of the last metallization level. Alternatively, the concentrator 12 may be provided on top of the contact pad 11.

A primary current I to be measured, flowing from or to the operative regions 28 through the plugs 26, the metal region 25, and the contact pad 11 to or from the wire 14, thus generates a magnetic field that is concentrated by the concentrator 12 in the sensitive region 13 and gives rise therein to a detectable Hall voltage $V_H$.

In particular, by simple calculations, it may be shown that the Hall voltage $V_H$ existing between the intermediate contacts 20b, 20d is proportional to the magnetic field B according to the following relation $$V_H \propto R_h V_c B \frac{L1}{\rho H} \propto R_h I_c B \frac{L1}{L2H} \quad (1)$$

where L1 is the length of the sensitive region 13 in the direction Y, L2 is the width of the sensitive region 13 in the direction X, as indicated above, H is its depth, B is the magnetic field concentrated by the concentrator 12, $V_c$ is the voltage across the portion of sensitive region 13 between the central contact 20c and each lateral contact 20a, 20e and proportional to the control current $I_c$ through the resistance R of the above portions of the sensitive region 13, and $R_h$ is the Hall coefficient:

$$R_h = \frac{p - nb^2}{e(p + nb)^2} \quad (2)$$

where p is the concentration of the acceptor ions, n is the concentration of donor ions in the sensitive region 13, $b=\mu_e/\mu_h$, i.e., the ratio between the mobility of the electrons and that of the holes in the silicon, and e is the elementary charge.

Since the current to be measured I and the magnetic field B generated thereby are linked by a relation of proportionality (in a per se known manner), and in view of the proportionality between the magnetic field B and the Hall voltage $V_H$ resulting from Eq. (1), it is thus possible, by measuring $V_H$, to obtain the value of the current to be measured I.

Eqs. (1) and (2) further express the relation between the Hall voltage $V_H$ and various design parameters of the device 100 that may be optimized in order to increase the sensitivity of the device 100. In particular, it may be noted how the doping level of the sensitive region 13 (and thus its conductivity) may be optimized in the design stage to obtain the desired sensitivity.

In practice, the device 100 may be provided with storage elements that store the relation that exists between the Hall voltage and the current to be measured I on the basis of the various design parameters and that is used in reading during operation of the device. The above table may be loaded/modified in the testing stage for taking into account the effective values of the physical parameters of the device, thus guaranteeing a high precision.

The device 100 may be manufactured in the way described hereinafter.

Figure 7A:
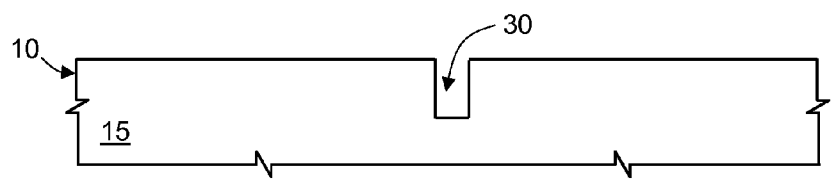
FIGS. 7A and 7B are, respectively, a cross-section similar to that of FIG. 4 and a top plan view, in a first manufacture step of the device.
Figure 7B:
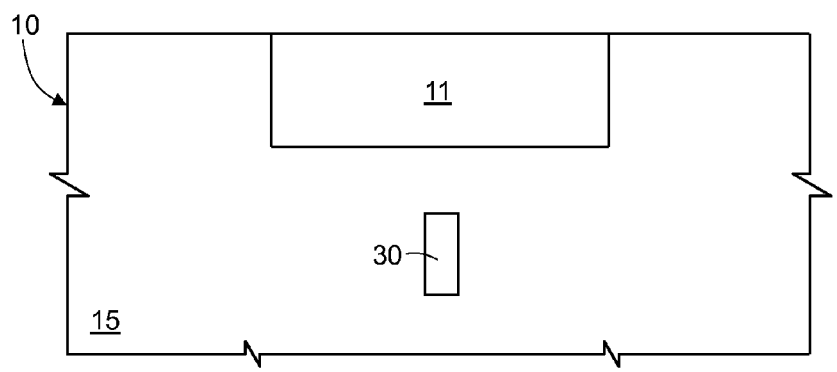

After possibly forming components within and on the substrate 16, the insulating layer 15 on the substrate 16 (FIG. 4), the regions and electrical-connection lines (including the metal region 25 and the plugs 26) in the insulating layer 15, and the contact pad 11, a sensor trench 30 is formed laterally to the contact pad (FIGS. 7A and 7B). To this end, any known photolithographic technique may be used.

Figure 8A:
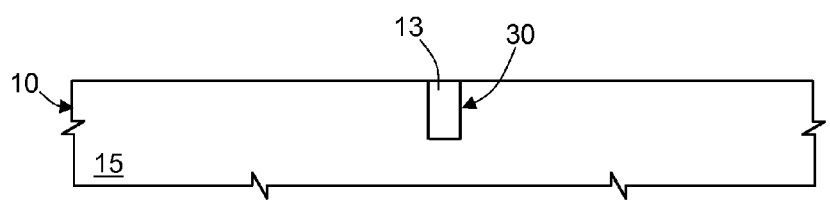
FIGS. 8A, 8B, 9A, 9B and 10A, 10B are views similar to those of FIGS. 7A and 7B, respectively, in subsequent manufacturing steps.
Figure 8B:
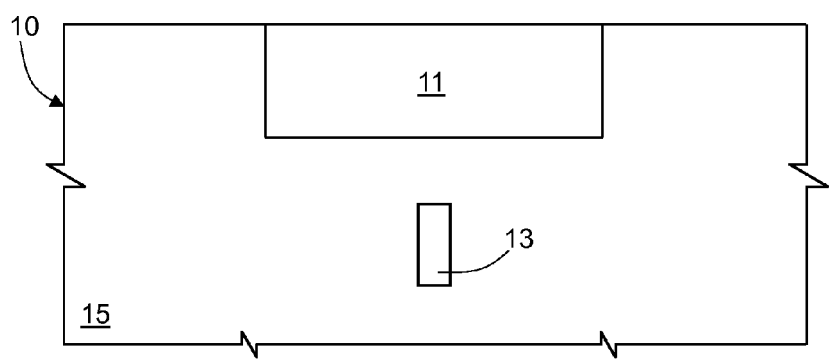

Next (FIGS. 8A and 8B), the sensor trench 30 is filled with polysilicon. In particular, polycrystalline silicon is deposited at a high temperature, for example, between 600° C. and 700° C., and the material in excess on the outside of the sensor trench 30 is removed, for example, via CMP. In this way, the sensitive region 13 is formed within the trench 30.

Figure 9A:
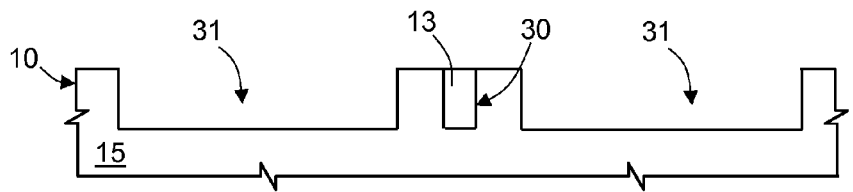
Figure 9B:
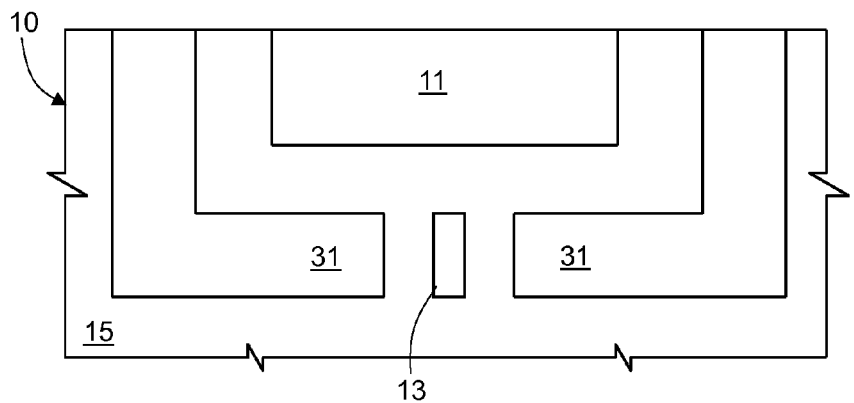

Next (FIGS. 9A and 9B), using known phototechnical steps, a concentrator trench 31 is formed. The concentrator trench 31 is C-shaped, as may be seen in the top plan view of FIG. 9B, corresponding to the desired shape for the concentrator 12, and is thus generally annular, interrupted in proximity of the sensitive region 13. The concentrator trench 31 has a thickness slightly greater than the sensor trench 30, as may be noted in FIG. 9A.

Figure 10A:
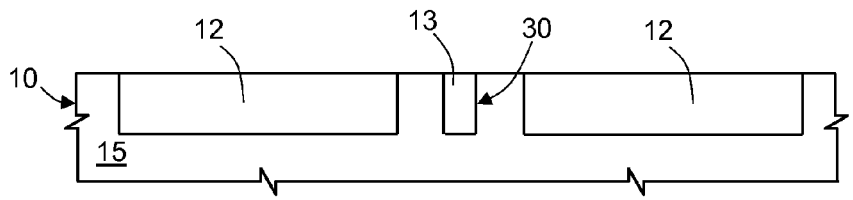
Figure 10B:
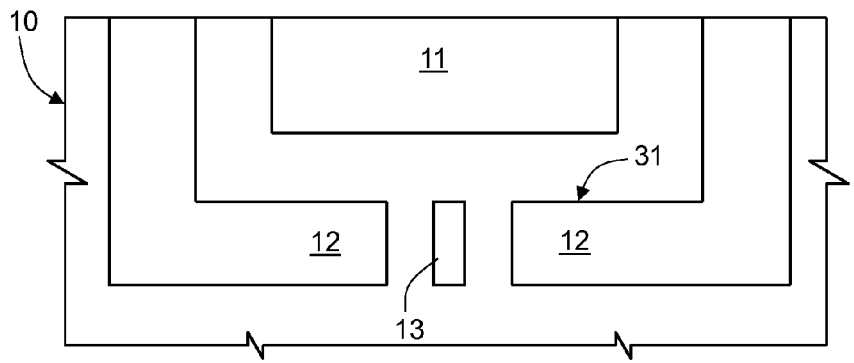

Then (FIGS. 10A and 10B), the ferromagnetic material of the concentrator, for example, nickel, is deposited and fills the concentrator trench 31. The nickel in excess on the outside of the concentrator trench 31 is then removed via CMP. The concentrator 12 is thus obtained.

Finally, the contacts 20a-20e are formed on top of the sensitive region 13 (FIGS. 3-5), in a per se known manner. Final standard steps then follow, including forming the passivation and bonding the wire 14, to obtain the final structure shown in FIGS. 2-6.

The device and the manufacturing process described herein have numerous advantages.

First, the present device enables high-precision measurement of the current flowing in a conductive region, since it enables measurement of the entire current, instead of just a part, as occurs in some known integrated devices.

By modifying the parameters of the ferromagnetic material, the position and shape of the concentrator, the control current $I_c$, and the geometrical and electrical characteristics of the sensitive region 13, such as its doping level, it is possible to vary the measured Hall voltage $V_H$ from a few nanovolts to hundreds of millivolts, according to the need and the applications.

The device enables measurement of currents in an integrated device accommodating an integrated circuit or may be provided as stand-alone device, generally operating as current sensor. Furthermore, the current source 24 and the voltmeter 22 may be integrated or external, and the contact pad 11 may be connected to another contact region accessible from outside.

The sensor has very small dimensions and may thus be directly integrated in an integrated circuit. This enables, for example, using the current measure directly by the integrated circuit, for example, for testing operations and/or the use of the measured current by the functions of the circuit.

The sensor enables a simple current measure. Furthermore, in particular when the concentrator is formed above the uppermost metallization level, the present sensor practically does not cause any increase of area. This is particularly advantageous, for example, in power devices, for instance, for driving external loads, where it is possible to directly measure the current supplied to apparatuses and external and/or internal devices. In this case, it is further possible to provide a current sensor around each contact pad for detecting the current delivered through each of them.

Finally, it is clear that modifications and variations may be made to the device and to the process described and shown herein, without thereby departing from the scope of the present disclosure.

For instance, the concentrator and the conductive region could be formed in the substrate, instead of on top, and their shape may vary with respect to what shown and described herein. For instance, the concentrator may have an open circular, oval, or polygonal shape.

In addition, the sensitive region 13 may have only four contacts, two for conducting the control current and two for detecting the Hall voltage $V_H$.

Furthermore, the concentrator, instead of being underneath the contact pad, could extend at a level higher than this.

The sequence of the steps for forming the sensitive region 13 and the concentrator 12 may further be reversed since it is possible to provide first the sensitive region 13 and the concentrator 12 and then the contact pad.

The Hall cell and the corresponding concentrator 12 may further be formed in the substrate.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated semiconductor device comprising:
a semiconductor substrate;
an insulating layer overlying the substrate;
a conductive region configured to be traversed by a current to be measured;
a concentrator of ferromagnetic material partially surrounding the conductive region, the concentrator having an annular shape open at a point defining a gap area; and
a sensitive region, which is electrically conductive, arranged in the gap area, wherein the sensitive region and the concentrator are formed in the insulating layer.

2. The device according to claim 1, wherein the gap area is delimited between two facing ends of the concentrator, and the sensitive region has a generally parallelepipedal shape, having a width in a first direction transverse to the end of the concentrator and a length in a second direction perpendicular to the first direction, wherein the length is larger than the width.

3. The device according to claim 2, wherein the sensitive region and the concentrator have respective depths in a third direction perpendicular to the first and second directions, and the depth of the sensitive region is smaller than the depth of the concentrator.

4. The device according to claim 2, wherein the sensitive region has a plurality of contacts extending over a same top surface of the sensitive region, the plurality of contacts including a plurality of control-current conduction contacts and a pair of voltage-detection contacts.

5. The device according to claim 4, wherein:
the plurality of control-current conduction contacts comprises:
a first control-current conduction contact arranged on a longitudinally central area of the surface of the sensitive region,
a second control-current conduction contact arranged at a first longitudinal end of the surface of the sensitive region, and
a third control-current conduction contact arranged at a second longitudinal end of the surface of the sensitive regions, the first longitudinal end being opposite to the second longitudinal end;
the plurality of contacts includes:
a first voltage-detection contact arranged between the first and second control-current conduction contacts, and
a second voltage-detection contact arranged between the first and third control-current conduction contacts.

6. The device according to claim 4, wherein the contacts longitudinally extend parallel to the first direction.

7. The device according to claim 1, wherein the conductive region is a contact pad formed on the insulating layer.

8. The device according to claim 1, comprising a voltmeter and a current source electrically coupled to the sensitive region.

9. The device according to claim 8, wherein the voltmeter and the current source are integrated in the substrate.

10. The device according to claim 1, wherein:
the substrate is a semiconductor substrate an includes an operative region configured to conduct the current to be measured;
the conductive region includes:
a metal contact formed on a top surface of the insulating layer; and
a metal region that extends laterally in the insulating layer and is surrounded by the concentrator, the metal region being electrically coupled to the operative region and the metal contact and being spaced apart from the top surface of the insulating layer; and
the concentrator is arranged in the insulating layer and above the metal region.

11. A process for manufacturing an integrated semiconductor device comprising:
forming an insulating region;
forming a conductive region configured to be passed by a current to be measured;
forming a concentrator of magnetic material in the insulating region and partially surrounding the conductive region, the concentrator having an annular shape open at a point defining a gap area of the insulating region; and forming an electrically conductive sensitive region in the gap area of the insulating region.

12. The process according to claim 11, wherein:
forming the sensitive region includes forming a first trench in the insulating region and filling the first trench with doped semiconductor material;
forming the concentrator includes forming in the insulating region a second trench having an open annular shape defining the gap area; and filling the second trench with ferromagnetic material.

13. The process according to claim 12, comprising:
before forming the insulating region, forming components in a substrate of semiconductor material, and
forming metallization regions and lines in the insulating region, before forming and filling the first and second trenches.

14. The process according to claim 13, wherein the conductive region is a contact pad formed on the insulating region.

15. An integrated semiconductor device comprising:
a semiconductor substrate;
an insulating layer overlying the substrate;
an integrated circuit formed in the substrate and including a conductive region configured to be traversed by a current to be measured; and
a current sensor integrated in the insulating layer and including:
  a concentrator of ferromagnetic material partially surrounding the conductive region, the concentrator having an annular shape open at a point defining a gap area; and
  a sensitive region, which is electrically conductive, arranged in the gap area, wherein the sensitive region and the concentrator are formed in the insulating layer.

16. The device according to claim 15, wherein the gap area is delimited between two facing ends of the concentrator, and the sensitive region has a generally parallelepipedal shape, having a width in a first direction transverse to the end of the concentrator and a length in a second direction perpendicular to the first direction, wherein the length is larger than the width.

17. The device according to claim 16, wherein the sensitive region and the concentrator have respective depths in a third direction perpendicular to the first and second directions, and the depth of the sensitive region is smaller than the depth of the concentrator.

18. The device according to claim 16, wherein the sensitive region has a plurality of contacts extending over a same top surface of the sensitive region, the plurality of contacts including a plurality of control-current conduction contacts and a pair of voltage-detection contacts.

19. The device according to claim 18, wherein:
the plurality of control-current conduction contacts comprises:
  a first control-current conduction contact arranged on a longitudinally central area of the surface of the sensitive region,
  a second control-current conduction contact arranged at a first longitudinal end of the surface of the sensitive region, and
  a third control-current conduction contact arranged at a second longitudinal end of the surface of the sensitive regions, the first longitudinal end being opposite to the second longitudinal end;
the plurality of contacts includes:
  a first voltage-detection contact arranged between the first and second control-current conduction contacts, and
  a second voltage-detection contact arranged between the first and third control-current conduction contacts.

20. The device according to claim 18, wherein the contacts longitudinally extend parallel to the first direction.

21. The device according to claim 15, wherein the conductive region is a contact pad formed on the insulating layer.

22. The device according to claim 15, comprising a voltmeter and a current source electrically coupled to the sensitive region, wherein the voltmeter and the current source are integrated in the substrate.

23. The device according to claim 15, further comprising:
a metal contact formed on a top surface of the insulating layer; and
a metal region that extends laterally in the insulating layer and is surrounded by the concentrator, the metal region being electrically coupled to the conductive region and to the metal contact and being spaced apart from the top surface of the insulating layer, wherein the concentrator is arranged in the insulating layer and above the metal region.

* * * * *